United States Patent [19]
Meyerson

[11] Patent Number: 5,316,958
[45] Date of Patent: May 31, 1994

[54] METHOD OF DOPANT ENHANCEMENT IN AN EPITAXIAL SILICON LAYER BY USING GERMANIUM

[75] Inventor: Bernard S. Meyerson, Yorktown Heights, N.Y.

[73] Assignee: International Business Machines Corporation, Armonk, N.Y.

[21] Appl. No.: 531,218

[22] Filed: May 31, 1990

[51] Int. Cl.$^5$ .................... H01L 21/20; H01L 21/265
[52] U.S. Cl. ...................................... 437/31; 437/106; 437/950; 437/971
[58] Field of Search ...................... 148/DIG. 18, 41, 2, 148/58, 59, 72, 97, 155, 169; 156/610–614; 427/248.1, 255.1; 357/16, 17; 437/31, 81, 88, 105, 106, 108, 110, 126, 131, 937, 939, 951, 959, 971

[56] References Cited

U.S. PATENT DOCUMENTS

| | | | |
|---|---|---|---|
| 4,111,719 | 9/1978 | Mader et al. | 437/24 |
| 4,133,701 | 1/1979 | Greenstein et al. | 437/24 |
| 4,137,103 | 1/1979 | Mader et al. | 148/33 |
| 4,385,938 | 5/1983 | Park et al. | 148/1.5 |
| 4,442,449 | 4/1984 | Lehrer et al. | 148/33.1 |
| 4,695,859 | 9/1987 | Guha et al. | 357/17 |
| 4,717,681 | 1/1988 | Cunan | 437/106 |
| 4,857,270 | 8/1989 | Marnya et al. | 437/131 |
| 4,870,030 | 9/1989 | Markunas et al. | 437/81 |
| 4,891,329 | 1/1990 | Reisman et al. | 437/86 |
| 4,958,201 | 9/1990 | Mimura | 357/16 |
| 4,997,776 | 3/1991 | Harame et al. | 437/131 |

OTHER PUBLICATIONS

Gibbons et al. "Si/Si$_{1-x}$Ge$_x$ Heterojunction Bipolar Transistors Fabricated by Limited Reaction Processing" IEDM 1988, pp. 567–569 (1988).

Patton et al. "SiGe-Base, Poly-Emitter Heterojunction Bipolar Transistors"; IBM Research Division, T. J. Watson Research Center N.Y. 10598, 1989 Symp. in VLSI, Digest of Clinical Paper pp. 95–96 (1989).

Fischer et al. "A 45 GHz Strained-Layer Heterojunction Bipolar Transistor Fabricated with Low Temperature EPI" IBM T. J. Watson Research Center, N.Y. 10598, IEDM pp. 27.7.1–27.7.3 (1989).

Manasevit et al., "The Properties of Si/Si$_{1-x}$Ge$_x$ Films . . . ", J. Electron. Mat. vol. 12, No. 4, Jul. 1983, pp. 637–651.

Meyerson et al., ". . . Silicon/Germanium Low-Temperature Epitaxy", Appl. Phys. Lett., 53(25), 19 Dec. 1988, pp. 2555–2557.

Wang et al., "High Hole Mobility in Si/Si$_{1-x}$Ge$_x$/Si P-Type . . . ", Appl. Phys. Lett., 55(22), 27 Nov. 1989, pp. 2333–2335.

Srinivasan et al., "Current Status of Reduced Temperature Silicon Epitaxy by Chemical Vapor Deposition," Electrochemical Society, 1985.

Meyerson et al., "Low Temperature Silicon Epitaxy by Hot Wall Ultrahigh Vacuum/Low Pressure Chemical Vapor Deposition Techniques", Applied Physics Letter, 1986.

Meyerson et al., "Phosphorus-Doped Polycrystalline Silicon Via LPCVD," Journal Electrochemical Society. 131(10) 1984.

Meyerson, "Phosphorus-Doped Polycrystalline Silicon Via LPCVD," J. Electrochem. Soc., vol. 131, No. 10 (Oct. 1984).

Yu, et al., "The Adsorption of PH$_3$ on Si(100) and Its Effect on the Coadsorption of SiH$_4$, " J. Vac. Sci, Technol. A., vol. 2, No. 2, Apr.–Jun. 1984.

*Primary Examiner*—Olik Chaudhuri
*Assistant Examiner*—Ramamohan Kao Paladugu

[57] ABSTRACT

An in-situ doped n-type silicon layer is provided by a low temperature, low pressure chemical vapor deposition process employing a germanium-containing gas in combination with the n-type dopant containing gas to thereby enhance the in-situ incorporation of the n-type dopant into the silicon layer as an electronically active dopant. Also provided are a silicon layer including a P-N junction wherein the layer contains an n-type dopant and germanium, and devices such as transistors incorporating an in-situ n-doped silicon layer.

25 Claims, 2 Drawing Sheets

METHOD OF DOPANT ENHANCEMENT IN AN EPITAXIAL SILICON LAYER BY USING GERMANIUM

TECHNICAL FIELD

The present invention is concerned with a n-type silicon layer which includes an n-type dopant and germanium wherein the germanium is present in an amount that does not necessarily result in a significant decrease in the band gap of the layer. In addition, the present invention is concerned with a method for epitaxially depositing an in-situ doped n-type silicon layer onto a substrate, and is particularly concerned with a low temperature, low pressure chemical vapor deposition method. The present invention is also concerned with deposited, in-situ doped n-type silicon layers obtained by the process of the present invention.

BACKGROUND ART

The current desire in the electronics industry to provide high performance integrated circuitry of reduced dimensions has created a tendency to employ lower processing temperatures. For instance, the dimensions of device layers deposited by silicon epitaxy at the more typical temperatures employed, for instance, temperatures greater than about 1000° C., are fixed at values greater than the diffusion length of dopants out of the substrate onto which the silicon is deposited. For instance, such dimensions are typically on the order of a micron or more. However, the production of thin epitaxial films of silicon having abrupt and arbitrary dopant profiles is vital in device and circuit fabrication, and particularly in applications such as scaled-down bipolar and CMOS VLSI circuits and processes.

Various attempts at achieving lower processing temperatures were not especially successful because of a number of problems that need to be overcome before reduced temperatures such as those below about 800° C. could be used. For instance, at such reduced temperatures, the number of epitaxial defects can increase markedly. Also, at such relatively low temperatures, dopant atoms do not have sufficient mobility to find electrically active substitutional sites in the silicon lattice.

However, various ones of these problems have been overcome and the ability to employ relatively low temperatures of 800° C. and less has been realized by employing ultrahigh vacuum as disclosed for instance by Meyerson, "Low-Temperature Silicon Epitaxy By Ultrahigh Vacuum/Chemical Vapor Deposition", *Applied Physics Letters* 48 (12), pp. 797-799, Mar. 24, 1986, Meyerson, et al., "Low Temperature Silicon Epitaxy By Hot Wall Ultrahigh Vacuum/Low Pressure Chemical Vapor Deposition Techniques: Surface Optimization", *Journal of the Electrochemical Society*, Vol. 133, No. 6, June 1986 and Srinivasan, et al., "Current Status of Reduced Temperature Silicon Epitaxy By Chemical Vapor Deposition", *Electrochemical Society*, Soft Bound Proceeding Series, Penington, N.J., 1985.

In addition, a particularly effective process employing low temperature and low pressure chemical vapor deposition of epitaxial silicon is disclosed in U.S. patent application Ser. No. 906,854 filed Sep. 12, 1986 and U.S. patent application Ser. No. 342,630 filed Apr. 9, 1989, disclosures of which are incorporated herein by reference. Although this process is especially effective for producing quality epitaxial silicon layers, such could still stand improvement with respect to the amount and uniformity of the in-situ n-type dopants provided. In particular, the deposition of in-situ doped n-type epitaxial silicon films is especially difficult at the lower processing temperatures of about 800° C. and less. This difficulty arises from the failure of the n-type dopants such as phosphorous and arsenic to bond substitutionally into the silicon lattice.

Moreover, additional complications arise from the time varying nature of phosphorous incorporation, where the quantity of phosphorous bound into the film in any coordination is a strong function of deposition time. This effect can be seen in FIG. 1, where a constant flow of phosphine into a 550° C. ultrahigh vacuum/chemical vapor deposition reactor results in a continually increasing phosphorous content in the film. Furthermore, electrical analysis of these layers shows that the phosphorous is electrically inactive and therefore ineffective as a n-dopant.

Accordingly, it is a primary object of this invention to provide an improved technique for low temperature deposition of in-situ n-doped silicon.

It is another object of this invention to provide enhanced n-type doping in a silicon film deposited by ultrahigh vacuum chemical vapor deposition (UHVCVD).

It is another object of this invention to provide an improved low temperature technique for fabricating silicon devices containing at least one pn junction.

It is another object of this invention to provide structures including a silicon layer therein which are n-doped as deposited, without the need for additional steps such as annealing to make the dopants electrically active.

It is another object of this invention to provide improved silicon products containing n-type doping, by the methods of this invention.

It is another object of this invention to provide an UHVCVD process that allows in-situ n-type doping of deposited silicon films, over a wide range of doping levels.

It is still another object of this invention to provide a method for and device having abrupt n-type doping profiles.

SUMMARY OF INVENTION

It has been found in accordance with the present invention that n-type dopants can be incorporated into a silicon film as electrically active impurities at temperatures well below those which were previously believed necessary for such purpose. In particular, the present invention makes the fabrication of in-situ deposited pn and np symmetric junctions possible, which in turn allows the fabrication of any silicon based device. The present invention makes it possible to control the quantity of the n-type dopant to thereby provide dopant uniformity. Dopant uniformity is a critical requirement for the high quality devices presently being demanded in the electronics industry.

In particular, one aspect of the present invention is directed to a method for depositing an in-situ doped n-type silicon layer onto a substrate. The method includes providing the substrate in a chemical vapor deposition reactor zone. The temperature in the chemical vapor deposition zone is about 800° C. or less and the base pressure in the reactor zone is an ultrahigh vacuum that is less than the partial pressures of any contaminants present in the chemical vapor deposition zone.

A gas-containing silicon is introduced into the reaction zone for the deposition of silicon on the substrate along with an n-type dopant-containing gas and a germanium-containing gas. The germanium-containing gas is present in an amount that is effective for enhancing the in-situ incorporation of the n-type dopant into the silicon layer as an electronically active dopant.

A further aspect of the present invention is concerned with products obtained by the above defined process, where such products are not obtainable with any other process at temperatures less than 750° C.

Furthermore, the present invention is concerned with a silicon layer, preferably epitaxial, that can be included in a complete NPN or PNP transistor, which layer includes an n-type dopant and germanium. The germanium is present in the silicon layer in the amount of about 1 to about 35 atomic percent.

BEST AND VARIOUS MODES FOR CARRYING OUT INVENTION

It has been found pursuant to the present invention that the inclusion of relatively minor amounts of a germanium-containing gas in the input gas in an ultrahigh vacuum/chemical vapor deposition UHVCVD reaction for forming an in-situ doped n-type (epitaxial) silicon layer results in the incorporation of stable and defined amounts of electrically active n-type dopant in the silicon film.

Figure 1:
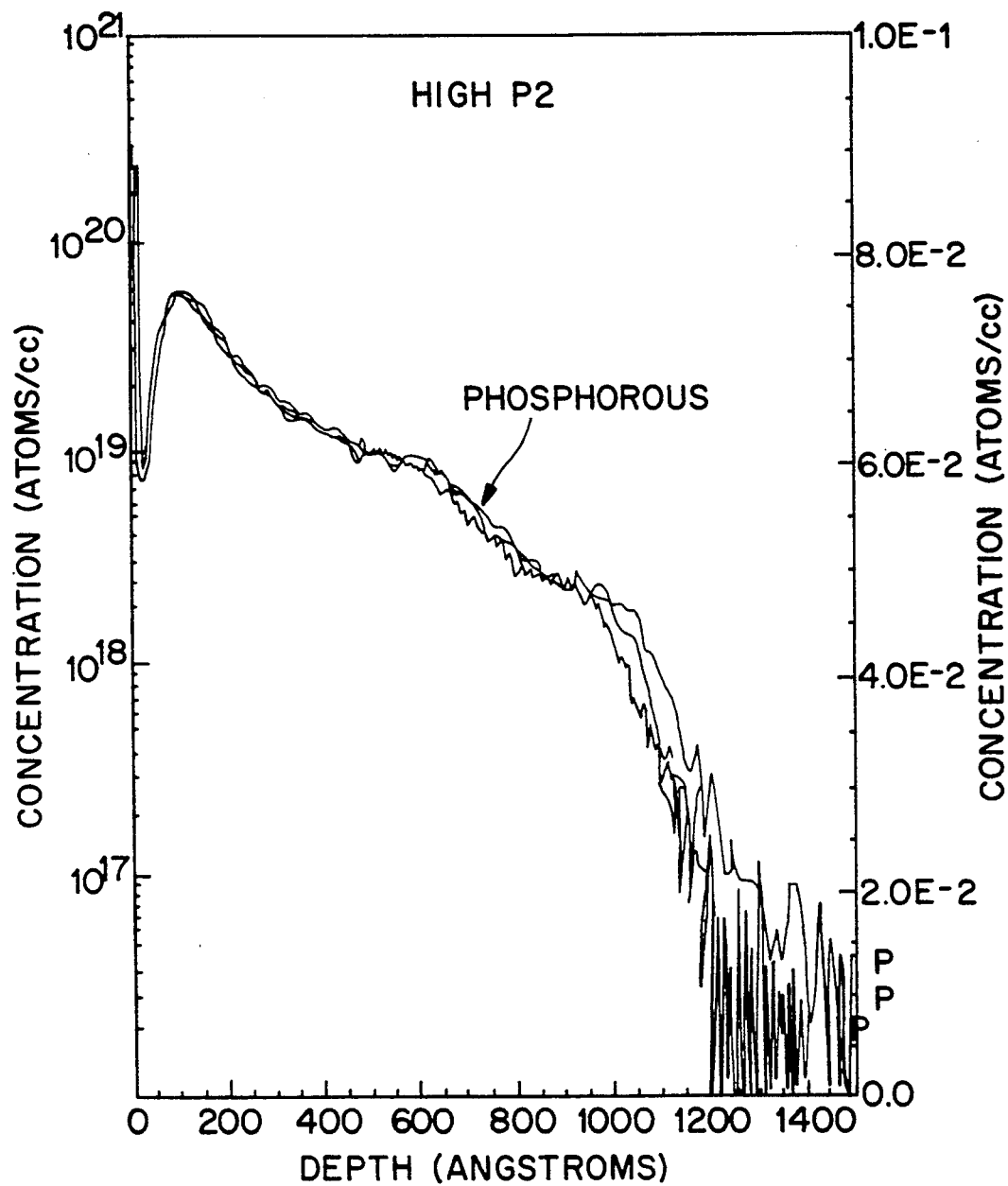
FIG. 1 illustrates the effect of doping with phosphorous according to prior art ultrahigh vacuum/chemical vapor deposition reaction.
Figure 2:
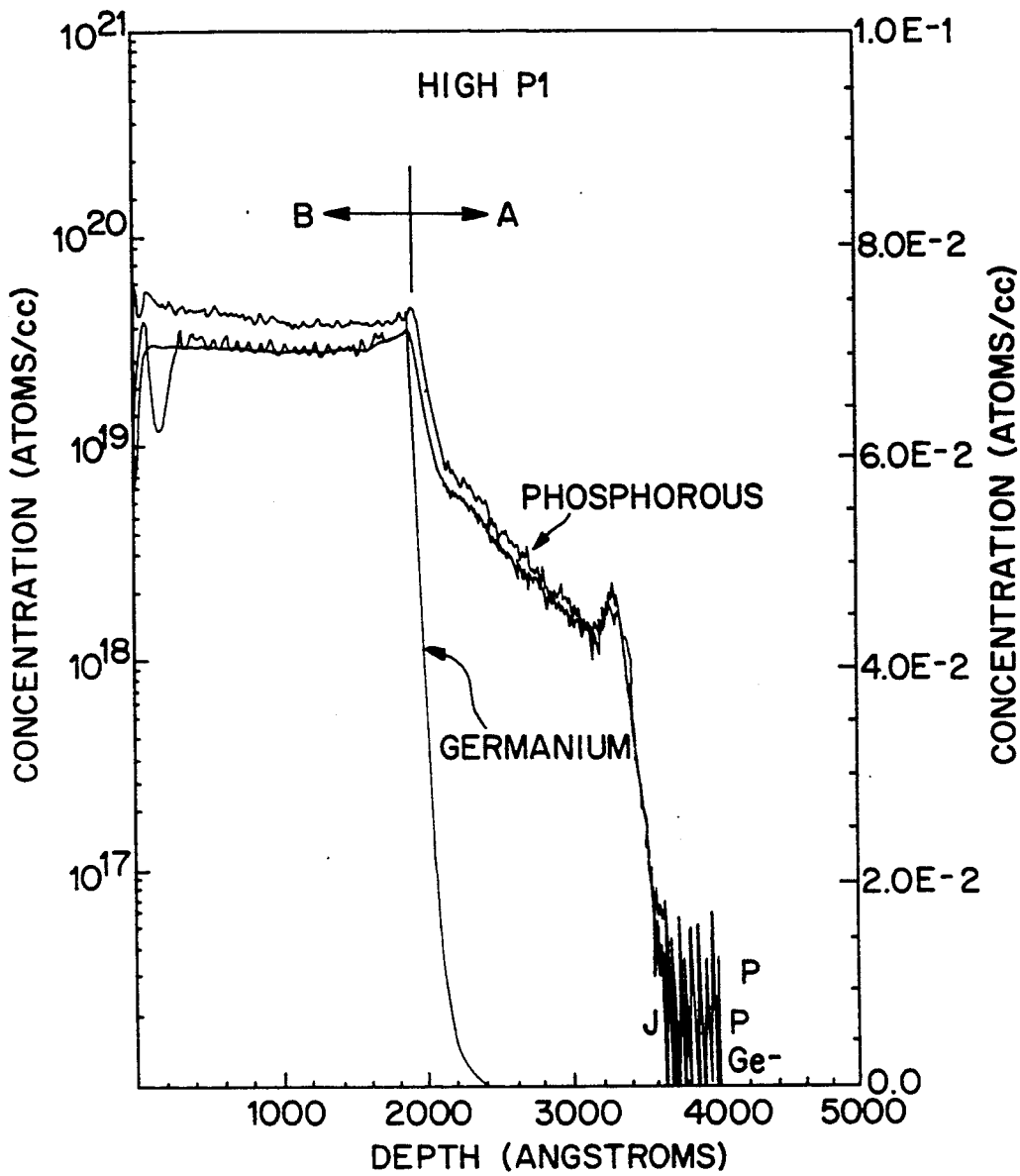
FIG. 2 illustrates the effect of employing germanium in combination with the n-type dopant pursuant to the present invention.

The surprising effect achieved by the present invention is demonstrated by a comparison of FIG. 1 with FIG. 2. In particular, FIG. 1 represents prior art whereby a constant flow of phosphine into a 550° C. ultrahigh vacuum/chemical vapor deposition reactor results in a continually increasing phosphorous content in the silicon film. Electrical analysis of these layers shows that the phosphorous is electrically inactive.

FIG. 2 and that portion of FIG. 2 identified as portion 2A substantially repeats the above process for the first 1500 angstroms of film growth whereby the same phenomena occurs as described for FIG. 1. On the other hand, that portion of FIG. 2 identified as portion 2B demonstrates the effect when a relatively small amount (i.e.—about 7 atomic percent) of a germanium-containing gas (such as germane) is included along with the phosphine in the input gas. The results demonstrate that the phosphorous content is increased to a stable value where it remains. Moreover, electrical analysis of this layer establishes that the phosphorous is fully activated.

As is apparent from portion B of FIG. 2, the onset of n-type dopant incorporation is extremely abrupt when the Ge-containing gas is introduced into the reaction zone. Even though the phosphine gas has been continually introduced, the incorporation of P as a fully electrically active dopant species does not occur, especially at high doping levels in excess of $10^{19}$ atoms/cc until the Ge-containing gas is introduced into the reaction zone.

At this time, the phosphorous dopant is incorporated in the proper substitutional sites in the silicon lattice as fully electrically active dopants.

For the low temperature (less than 750° C.) deposition of silicon, gaseous sources are required which will pyrolize at low temperatures. Typically, these will be gaseous sources containing hydrogen, such as silane ($SiH_4$). As a by-product of the decomposition of the growth species, H atoms can appear on the growth interface. Additionally, phosphorous acts as a poison for growth in that the P can tend to form clusters of $P_2$ on the silicon growth surface. When the phosphorous is present as clusters, electrically active dopants will not be produced in the proper sites in the silicon lattice. Also, these phosphorous clusters can hold H atoms on a silicon surface, as the P-H bonds are very strong. This tends to further inhibit both silicon growth and incorporation of fully electrically active n-dopant species.

It is believed that the presence of Ge aids in the desorption of H atoms from the growing surface, thereby allowing the n-dopant to go directly to a substitutional site in the lattice where it is fully electrically active as a dopant. However, the presence of Ge may still be helpful in the incorporation of n-dopant species even if hydrogen atoms are not present on the silicon surface, by enhancing the solubility of the n-dopant into the silicon at low temperatures. The net effect is that the presence of Ge increases the effective solubility of these n-dopants into silicon.

As noted, the presence of Ge is particularly important for low temperature n-doping of silicon, since it allows the in-situ incorporation of fully electrically active dopants. It also leads to an abrupt turn-on of doping activity thereby leading to the formation of very sharp pn junctions. The use of Ge in this manner is particularly applicable to chemical vapor deposition processes, but is also applicable to other processes utilizing gaseous sources. For example, vapor phase epitaxy using chemical vapor deposition or molecular beam epitaxy (MBE) with gas sources are examples of processes that can be used.

The use of a germanium-containing gas to achieve the results obtained by the present invention was not at all apparent from any prior art. In fact, to use germanium as a doping enhancement in heavily doped n-type material is contrary to prior uses of germanium whereby such is employed in the fabrication of bipolar transistor bases whose band gap is to be decreased. Although a reduced band gap is desired for the base region, most heavily doped n-type material is employed in the emitter of these devices (NPN), where an increase in band gap is desired. However, the amounts of the germanium used in the present invention are small enough that the primary band gap reduction mechanism is the presence of the n-type dopants at relatively high levels instead of the effect of the germanium. Accordingly, the germanium is present in this invention in an amount that is both effective for enhancing the in-situ incorporation of the n-type dopant into the silicon layer as an electronically active dopant, but less than that which would result in a significant decrease (e.g.—a decrease more than 100 meV) in the band gap in the device obtained. According to preferred aspects of the present invention, in a NPN transistor, about 1 to about 35 atomic percent of germanium is introduced in the case of a base and about 1 to about 20 atomic percent of germanium is introduced in the case of an emitter, and most preferably about 5 to about 20 atomic percent in the case of a base and about 2 to about 15 atomic percent in the case of an emitter.

The germanium-containing gas employed can be any germanium gas such as the germanium hydrides and preferably germane (i.e.—germanium tetrahydride) Another suitable germanium-containing gas is germanium tetrachloride.

The n-type dopants that can be employed are well known in the prior art and need not be described herein in any great detail. However, the preferred n-type dopants are phosphorous, arsenic, and antimony. The phosphorous-containing gas employed can be phosphine or $POCl_3$ with phosphine being most preferred due to its decomposition at low temperatures. Suitable arsenic-containing gases include arsine or $AsCl_3$. A suitable antimony gas is $SbH_3$.

The level of the n-type dopant in the silicon layer can vary over a wide range but generally is about $1 \times 10^{14}$ to about $1 \times 10^{20}$ atoms per $cm^3$. The doping level is determined based on the desired device characteristics.

The silicon source gas for the deposition of silicon is not especially critical and can be any of the silicon source gases known in the art such as silane, higher order silanes including disilane ($Si_2H_6$), and chlorosilanes such as $SiCl_4$, $SiH_2Cl_2$, $SiHCl_3$, and $SiH_3Cl$.

It is recognized that heterojunction bipolar transistors (HBT) have been fabricated in the art in both npn and pnp form. In pnp HBTs, a silicon base region is used in which Ge is present. Ge is used therein to decrease as much as possible the band gap of the base region in order to enhance operation of the transistors. However, those devices are generally made in a process wherein thermal diffusion, ion implantation or high growth temperatures are used to place the n-dopant species and Ge in the base region. High temperature steps, such as thermal diffusion and high temperature annealing or high growth temperatures are used to electrically activate the dopant species. Thus, in prior implanted pnp HBT's, the Ge is not introduced at the same time the n-type dopant is introduced in the base layer, in further distinction with the present invention where Ge and the n-dopant are present at the same time in the reaction zone. In deposited devices Ge and the dopant Sb are codeposited at high growth temperatures to activate the dopant, Sb. The Ge used in the present invention need not be used to significantly alter the band gap of the n-type silicon layer, but instead to enable full electrically active incorporation of n-type dopants in-situ. This creates very abrupt dopant profiles, and therefore enables the fabrication of very narrow structures.

Accordingly, in the practice of the present invention, the product obtained by the inventive process described herein is unique in its properties and can be used to provide advantageous devices, such as transistors. In bipolar transistors, it is desirable to have highly doped emitter regions where the band gap of the emitter is not appreciably reduced. Further, the emitter need not be single crystalline, since the strain produced in a single crystalline material can reduce the band gap of the emitter. By the use of this invention, n-type emitter layers can be produced with the desired doping levels and band gaps.

In heterojunction bipolar transistors using Si—Ge layers, it has been the case in the prior art that high temperatures have been required to incorporate sufficient quantities of electrically active dopants. However, high temperatures affect Si—Ge layers, causing them to relax by forming defects (dislocations) which in turn adversely affect device operation. The present invention avoids this problem by enhancing the incorporation of fully electrically active n-dopants at low temperatures without leading to defect formation.

The preferred apparatus as well as process parameters for carrying out the improved process of the present invention are those employed in U.S. patent application Ser. Nos. 906,854 and 07/342,630 disclosures of which are incorporated herein by reference. For instance, the apparatus employed is preferably a hot wall, isothermal chemical vapor deposition apparatus of the type shown in said U.S. application Ser. Nos. 906,854 and 342,630. Device quality epitaxial silicon layers can be deposited with this apparatus.

The deposition temperatures employed are about 300° C. to about 800° C. with the preferred temperatures being about 450° C. to about 750° C. and the most preferred being about 500° C. to about 550° C.

The base pressure employed is less than about $10^{-8}$ Torr and preferably less than about $1 \times 10^{-8}$ Torr. The apparatus employed is a flow system in which the source gases (silicon source gas, n-type dopant source gas and germanium source gas) are injected at one end and high-speed pumps operate at the other end, there being a load lock to eliminate contamination upon loading of the substrates prior to deposition. The system typically operates in a molecular flow regime where the total operating pressure of the source gases is less then several hundred m Torr during deposition. While the preferred total operating pressure of the source gases during deposition is about $10^{-2}$ to about $10^{-4}$ Torr, source gas pressures up to several hundred millitorr may be possible when very low growth temperatures of less than about 500° C. are used.

Accordingly, the present invention enhances the incorporation of n-type dopants into epitaxial silicon and provides for such to be incorporated as electronically active species without any additional steps, such as high temperature annealing and high temperature deposition as required in prior art techniques.

Figure 3:
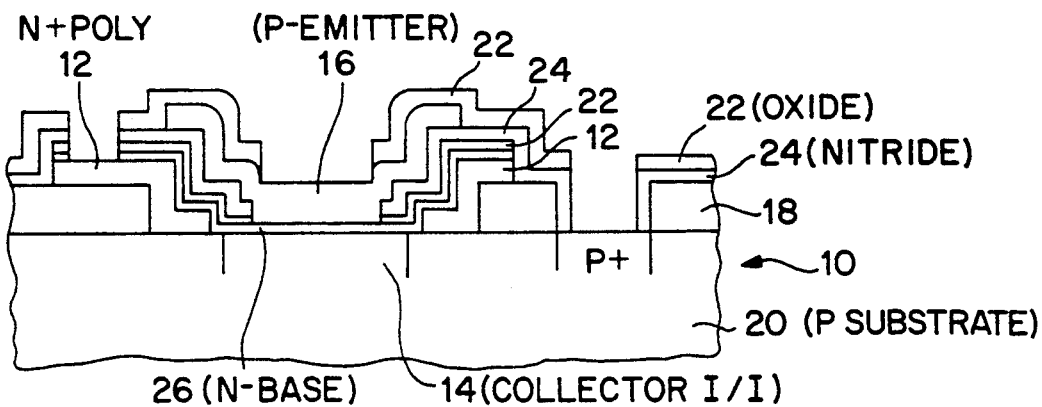
FIG. 3 is a cross-sectional view of a double epitaxial, double heterojunction PNP transistor illustrating a device made in accordance with the present invention.

FIG. 3 is a cross-sectional illustration of a double epitaxial double heterojunction PNP transistor in which both the base and emitter regions are formed by low temperature epitaxy using the aforementioned UHV/CVD process. A two-step epitaxial process is used wherein low temperature epitaxy is used to form the base region and another low temperature epitaxy step is used to form the emitter region.

In the formation of the transistor of FIG. 3, the base region is heavily doped (phosphorus $10^{19}cm^{-3}$) SiGe film. Advantage is taken of the epitaxial base technology because the thermal cycles following the base deposition, which can cause dopant diffusion and relaxation of highly strained layers, are eliminated. As will be seen, the insulating layers are formed by plasma enhanced CVD and the emitter region is formed by low temperature epitaxy, thereby limiting the temperature after base deposition to 550° C. and lower.

The transistor 10 is a non-self aligned structure that is used to illustrate low temperature processing technology in accordance with the present invention. Transistor 10 includes an extrinsic base polysilicon region 12 and an ion implanted collector region 14. Emitter 16 is also a low temperature epitaxial layer. A field oxide layer 18 overlies the p-type substrate 20. Plasma enhanced CVD is used to produce oxide layers 22 and a nitride layer 24.

Reference is made to D.L. Harame, et al. IEDM, pp. 889-890 (1988) and G.L. Patton, et al., VLSI Symposium, pp. 95-96 (1989) for discussions of a non-self aligned structure and method. The extrinsic base polysilicon 12 is patterned and etched to form a second, smaller window inside the opening in the field oxide 18 (the non-self aligned opening), through which boron is ion implanted and annealed to increase the collector doping concentration in ion implanted collector 14. The intrinsic base 26 is grown by UHV/CVD low temperature epitaxy at 550° C., as detailed by B.S. Meyerson, et al., Appl. Phys. Lett., Vol. 50, p. 113 (1987).

Thermal quality oxide layers 22 were deposited at 350° C. using plasma enhanced CVD. An emitter opening was then defined and etched within the non-self aligned opening and the single crystal emitter 16 was deposited by UHV/CVD at 550° C.

As an alternative structure a NPN transistor can be made using the same process as that used to make the transistor of FIG. 3, the only difference being that the conductivity types are interchanged.

As a consequence of the present invention, enhanced N-type doping is obtained, which allows wafer scale integration to be achieved. Since the uniformity of N-type doping concentration is extremely uniform across the wafer, integrated circuits can be made using all NPN or PNP devices, as well as with circuits including complementary devices. For example, a silicon wafer including a large number of integrated circuit chips can be processed at one time with excellent uniformity of device properties across the wafer. In particular, integrated silicon heterojunction bipolar transistors can be wafer scale integrated.

The following non-limiting example is presented to further illustrate the present invention.

EXAMPLE

An n-type epitaxial silicon layer is deposited onto a substrate by introducing $SiH_4$ at about 20 sccm (standard cubic cms per minute), $GeH_4$ at about 0.2 sccm, and 100 ppm $PH_3$ in He at about 4 sccm at a temperature of about 550° C. and total growth pressure of about 1.4 m Torr. The results obtained are illustrated in portion 2B of FIG. 2. The layer illustrated in portion 2B showed an n-type carrier density of about $4 \times 10^{19}$ electrons/cm$^3$ establishing full electrical activation of the phosphorous dopant present.

While the invention has been shown with respect to the embodiments described herein, it will be apparent to those of skill in the art that variations can be made therein without departing from the spirit and scope of this invention. For example, the exact operating parameters of the UHVCVD process described in the cited co-pending applications can be varied, and the silicon layer need not be epitaxial, although epitaxial deposition is often preferred. While thermal CVD systems are described in those cited co-pending applications, other types of excitation (plasma, etc.) will be recognized by those of skill in vapor deposition techniques as being suitable. Further, the degree of epitaxy is known to vary and need not be 100% lattice matching. Still further, the use of these silicon layers, having enhanced n-type doping, is not limited to any particular device, but can be used in bipolar transistors, diodes, Schottky barrier devices, FET's, etc.

What is claimed is:

1. A method for depositing an in-situ doped n-type silicon layer onto a substrate which comprises providing the substrate in a chemical vapor deposition reaction zone wherein the temperature in said reaction zone is about 800° C. or less and the base pressure in said zone is an ultrahigh vacuum; and introducing a gas containing silicon into said reaction zone for the deposition of silicon on said substrate, and simultaneously therewith introducing an n dopant-containing gas and a germanium-containing gas in an amount effective for enhancing the in-situ incorporation of said n-type dopant into said silicon layer as an electronically active dopant, wherein the silicon layer contains 35 atomic percent or less of Germanium.

2. The method of claim 1 wherein said temperature is about 300° C. to about 800° C.

3. The method of claim 1 wherein said temperature is about 450° C. to about 750° C.

4. The method of claim 1 wherein said temperature is about 500° C. to about 550° C.

5. The method of claim 1 wherein said base pressure is less than about $10^{-8}$ torr.

6. The method of claim 1 wherein the total operating pressure during deposition is about $10^{-2}$ to about $10^{-4}$ torr.

7. The method of claim 1 wherein said n-dopant containing gas is a gas-containing phosphorous or arsenic, antimony or mixtures thereof.

8. The method of claim 1 wherein said n-dopant containing gas is a phosphorous containing gas.

9. The method of claim 1 wherein said n-dopant containing gas is phosphine or $POCl_3$ or $PCl_3$.

10. The method of claim 1 wherein said n-dopant containing gas is phosphine.

11. The method of claim 1 wherein said germanium-containing gas is a germanium hydride.

12. The method of claim 1 wherein said germanium-containing gas is germanium tetrahydride.

13. The method of claim 1 wherein about 1 to about 35 atomic percent of germanium is produced in said deposited silicon layer.

14. The method of claim 1 wherein about 2 to 15 atomic percent of germanium is produced in said deposited silicon layer.

15. The method of claim 1 wherein about 1 to about 20 atomic percent of germanium is introduced into said deposited silicon layer.

16. The method of claim 1 wherein about 15 to 20 atomic percent of germanium is introduced into said deposited silicon layer.

17. The method of claim 1 wherein said gas-containing silicon is selected from the group of silane, higher order silanes, chlorosilanes, and mixtures thereof.

18. The method of claim 1 wherein said gas-containing silicon is silane.

19. In a chemical vapor deposition process for deposition of in-situ n-doped silicon on a substrate at a temperature less than 750° C. wherein the base pressure in the reaction zone where deposition occurs is less than about $10^{-8}$ torr, the improvement including introducing Ge into said deposited silicon during the incorporation of a n-type dopant species into said silicon, the amount of Ge incorporated into said silicon being sufficient to achieve full, as deposited, electrical activation of said n-type dopant species, wherein the silicon layer contains 35 atomic percent or less of Germanium.

20. The process of claim 19, where said temperature is less than 700° C.

21. The process of claim 19, where said chemical vapor deposition is thermally driven.

22. The process of claim 21, where said n-type dopant is selected from the group consisting of phosphorous, antimony, and arsenic.

23. A method for forming a silicon bipolar transistor having emitter, base and collector regions, said method being characterized by the steps of:
   depositing a silicon emitter layer by chemical vapor deposition at a temperature less than about 750° C., and
   in-situ doping said silicon emitter layer with a n-type dopant species, wherein Ge is incorporated into said emitter during said in-situ doping step in an amount sufficient to cause said n-type dopant species to be in-situ electrically active therein, where the silicon layer contains 35 atomic percent or less of Germanium.

24. The method of claim 23, where said base region is silicon.

25. The method of claim 23, where said silicon emitter is an epitaxial layer.

* * * * *